United States Patent [19]

Song et al.

[11] Patent Number: 5,885,355
[45] Date of Patent: Mar. 23, 1999

[54] SEMICONDUCTOR FABRICATION APPARATUS WITH A HANDLER

[75] Inventors: Byoung-Soo Song; Chan-Il Yu, both of Suwon, Rep. of Korea

[73] Assignee: Samsung Electronics Co., Ltd., Suwon, Japan

[21] Appl. No.: 773,880

[22] Filed: Dec. 26, 1996

[51] Int. Cl.$^6$ .................................................. C23C 16/00
[52] U.S. Cl. ...................... 118/719; 118/663; 118/707; 414/936; 414/937
[58] Field of Search .................................. 118/719, 663, 118/707; 414/936, 937, 939

[56] References Cited

FOREIGN PATENT DOCUMENTS 06-294707  10/1994  Japan .

*Primary Examiner*—R. Bruce Breneman
*Assistant Examiner*—Jeffrie R. Lund
*Attorney, Agent, or Firm*—Jones & Volentine, L.L.P.

[57] ABSTRACT

A semiconductor fabrication apparatus having a process chamber and a handler which is provided for loading wafers into the process chamber or unloading wafers therefrom, comprising a plurality of switches for detecting positions of the handler and for generating detection signals in accordance with the positions; and an indicator for indicating normal operations of the switches. The indicator has relays operated in accordance with a voltage level of each of the detection signals; and LEDs associated with each of the relays, for identifying a normal operation of the handler. By confirming the conductive/nonconductive state of the LED, the operator can easily determine if the switches are accurately detecting the position of a load fork and/or an aligning plate.

8 Claims, 2 Drawing Sheets

SEMICONDUCTOR FABRICATION APPARATUS WITH A HANDLER

BACKGROUND OF THE INVENTION

1. Field of the Invention

The present invention relates to a semiconductor fabrication apparatus such as a chemical vapor deposition (CVD) apparatus, and more particularly, to an improvement in a handler for loading and unloading wafers into and from a process chamber.

2. Description of the Related Art

In a semiconductor fabrication apparatus having a process chamber, a handler is provided to load wafers into the process chamber or to unload wafers from the process chamber.

In one such semiconductor fabrication process, for example, a thin film growth technique, generally referred to as a chemical vapor deposition (CVD) method, forms a thin film of polycrystalline, such as silicon (Si), silicon nitride ($Si_3N_4$) and silicon dioxide ($SiO_2$), on a semiconductor wafer using a chemical reaction in a high temperature environment or an activated environment. The chamber of the CVD equipment, which forms a thin film on a wafer using this CVD method, must be kept in a vacuum state and is equipped with a load fork which loads wafers into the chamber or unloads them therefrom.

The CVD equipment generally consists of two chambers, that is, a load chamber and a process chamber. The load chamber is provided to pre-locate wafers to be processed or temporarily house or store wafers that have been processed, prior to their transfer to another process stage. The process chamber forms a thin film on a semiconductor substrate using an evaporation process. The load chamber includes an aligning plate on which the wafers to be processed are located, and a load fork which picks a wafer up from the aligning plate and loads it into the process chamber. The load fork also unloads the wafer from the process chamber that has been processed and lays it down on the aligning plate.

When the aligning plate is horizontal during the time the wafer is in the process chamber, the aligning plate is said to be in an 'up' state. When the load fork places and aligns a wafer on the aligning plate prior to loading the wafer in the process chamber, or aligns the wafer unloaded from the process chamber on the aligning plate, the aligning plate is vertical, and it is said to be in a 'down' state. The position of the aligning plate, whether seated horizontally or erected vertically, is detected by at least two micro limit switches and the result of the detection is provided to an equipment controller.

As for the load fork, when the load fork is dropped or is in stand-by, it is said to be in a 'down' state. The dropped or stand-by state of the load fork occurs when the wafers are placed or loaded in the load chamber, or when the wafers are placed on the wafer chuck, or when the wafers are taken from the process chamber. When the load fork picks up the wafers after processing and transfers them, the load fork is said to be in an 'up' state. The change in state of the load fork may be also detected by the two micro limit switches and the result of the detection is transferred to the equipment controller.

FIG. 1 shows an assembly for driving the load fork which constitutes one of the handlers of a CVD equipment. Referring to FIG. 1, there is shown actuator anchors 1, crank linkages 2, speed adjustors 3, air connection parts 4, eccentric wheel washers 5, micro limit switches 6, and sensing bars 7 for the micro limit switches, respectively.

In the CVD equipment, the micro limit switches 6 detect whether the load fork or the aligning plate is 'down' or 'up'. When the driving shaft of the load fork/aligning plate pushes down the sensing bars 7 of micro limit switches 6, then electrical signals are supplied to a data input board. The position of the load fork and the aligning plate is thus displayed on a diagnostic display. The electrical signals generated from the micro limit switches 6 are also supplied to the equipment controller. The controller then detects the signals and carries out a handling sequence control.

As described above, if the sensing bars 7 for the micro limit switches 6 are pushed down and electrical signals of a predetermined level are generated from normal open terminals of the micro limit switches 6, the equipment controller can determine whether the load fork or the aligning plate is in the 'up' or 'down' state.

As this equipment is operated continually in the production line, however, the sensing bars 7 frequently break down since they are formed with a thin plate, or the contact points of the switches 6 frequently burn out. The equipment controller, therefore, can not detect the position of the load fork or the aligning plate. A problem arises in that it becomes impossible to carry out an accurate sequencing control.

More specifically, when the load fork is actually in the 'down' state, if the sensing bar 7 for the micro limit switch 6 is broken, or the contact points of the micro limit switch 6 are burned out, the controller can not detect if the load fork is actually 'down', so that an error occurs in the sequence control for the load fork.

When an error occurs in the sequence control of the load fork or the aligning plate, the error may be detected by using a DVM (digital voltage meter) to determine whether the error is due to the breakage of the micro limit switches 6. Such an error detection procedure takes time, however, resulting in increased maintenance time for the equipment.

SUMMARY OF THE INVENTION

It is therefore an object of the present invention to provide a semiconductor fabrication apparatus with a handler where the cause of an error in the sequence control of the handler may be easily determined.

To achieve these and other objects, a semiconductor fabrication apparatus according to the present invention comprises a process chamber and a handler which is provided for loading wafers into the process chamber or unloading wafers from the process chamber. The apparatus comprises a plurality of switches provided for detecting positions of the handler and for generating detection signals in accordance with the positions. Also included is a means for indicating whether the switches are operating normally. The indicating means comprises a plurality of relays operated in accordance with a voltage level of each of the detection signals; and LEDs (light emitting diodes) associated with each of the relays, for identifying a normal operation of the handler.

According to the semiconductor fabrication apparatus of the present invention, it can easily be determined whether the micro limit switches are operating properly in detecting the position of the load fork and/or the aligning plate.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF THE PREFERRED EMBODIMENTS

In the following discussion it is assumed that the semiconductor fabrication apparatus with which the present invention is implemented has two chambers, i.e., a load chamber and a process chamber. The load chamber is provided to pre-locate wafers to be processed or to temporarily store wafers that have been processed. The process chamber forms a thin film on a semiconductor substrate during an evaporation process. The load chamber includes an aligning plate on which wafers to be processed are located, and a load fork which picks a wafer up from the aligning plate and loads it into the process chamber, or unloads the wafer that has undergone a process and lays it down on the aligning plate. The load fork and the aligning plate have respective micro limit switches for detecting 'up' and 'down' states.

Figure 1:
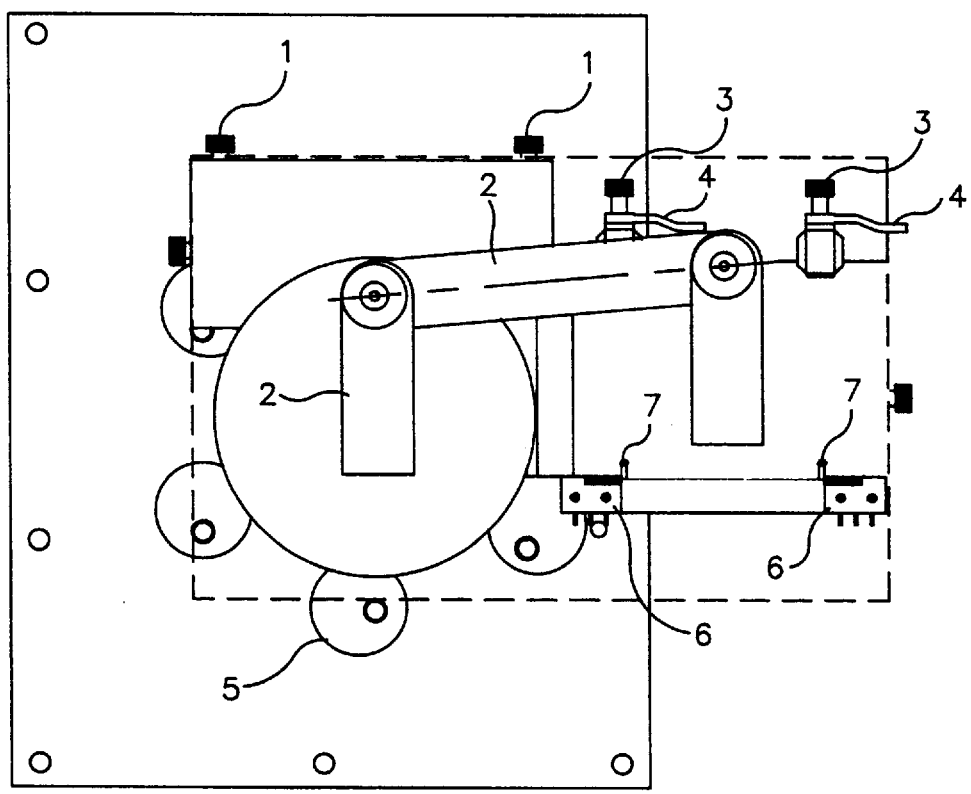
FIG. 1 is a schematic view showing a load fork driving assembly of a conventional CVD (chemical vapor deposition) equipment.
Figure 2:
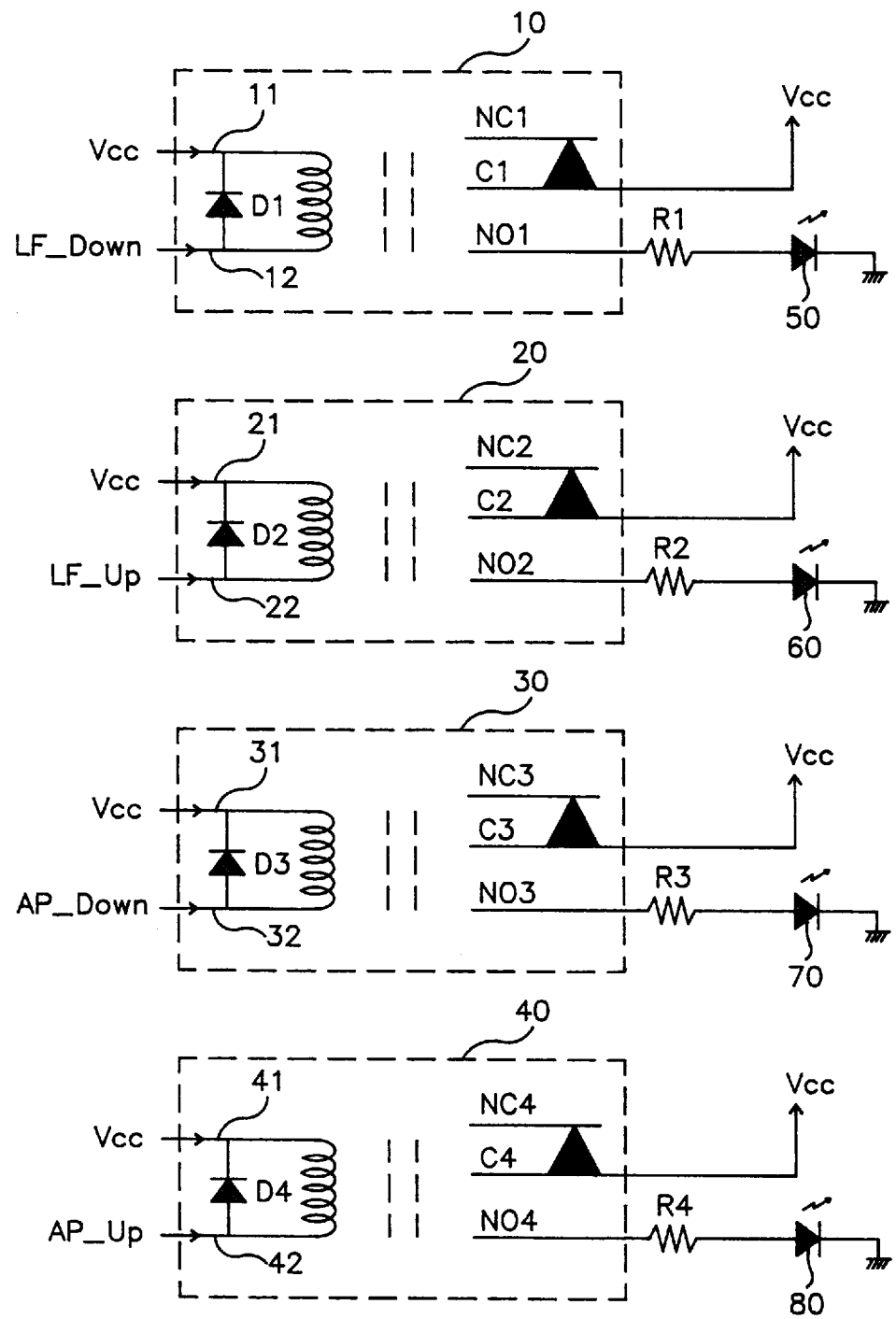
FIG. 2 is a diagram showing micro limit switches located in a handler to which a state indicating circuit is applied in accordance with the present invention.

Referring to FIG. 2, a state indicating circuit of a micro limit switch according to the present invention comprises first, second, third and fourth relays 10, 20, 30 and 40, and first, second, third and fourth LEDs (Light Emitting Diodes) 50, 60, 70 and 80. The first and the second relays 10, 20 and the first and the second LEDs 50, 60 are provided for the load fork, and the remaining relays 30, 40 and LEDs 70, 80 are provided for the aligning plate.

Each of the relays 10, 20, 30 and 40 has two input terminals (11,12; 21,22; 31,32; 41,42), a normal open terminal (NOx), a common terminal (Cx) and a normal close terminal (NCx). The common terminal and one of the two input terminals are commonly connected to a power source Vcc. The other input terminals of the relays 10, 20, 30 and 40 are respectively connected to a normal open terminal LF_Down of a first micro limit switch that is provided for detecting the down state of the load fork, a normal open terminal LF_Up of a second micro limit switch that is provided for detecting the up state of the load fork, a normal open terminal AP_Down of a third micro limit switch that is provided for detecting the down state of the aligning plate, and a normal open terminal AP_Up of a fourth micro limit switch that is provided for detecting the up state of the aligning plate.

The normal open terminals NO1, NO2, NO3, and NO4, of the relays are respectively connected through resistors R1–R4 to anodes of LEDs 50, 60, 70 and 80. Cathodes of the LEDs are commonly connected to a ground.

In the above circuit of the present invention, if the sensing bar 7 of a micro limit switch 6 of the load fork or the aligning plate is pushed, the zero volt at the normal open terminal LF_Down, LF_Up, AP_Down, or AP_Up, of the micro limit switch 6 is applied to an input terminal 12, 22, 32, or 42, of the corresponding relay. A current signal then flows through the corresponding relay so that the common terminal Cx of the corresponding relay is separated from the normal close terminal NCx and connected to the normal open terminal NOx. As a result, the LED connected to the corresponding relay is conductive or is turned on.

If the sensing bar 7 of a micro limit switch 6 is broken, or the contact points of the micro limit switch 6 are burned out, the corresponding relay is not operated so that the common terminal Cx thereof is continuously connected to the normal close terminal NCx. The LED connected to the corresponding relay is thus continuously turned off (nonconductive state).

By confirming the conductive/nonconductive state of the LED, the operator can easily determine if the micro limit switches are correctly detecting the position of the load fork and/or the aligning plate. Therefore, the time required for maintaining the equipment can be reduced and an accurate sequence control can be achieved.

While the present invention has been particularly shown and described with reference to the particular embodiments thereof, it will be understood by those skilled in the art that various changes in form and details may be effected therein without departing from the spirit and scope of the invention as defined by the appended claims and their equivalents.

What is claimed is:

1. A semiconductor fabrication apparatus having a process chamber and a handler which is provided for loading wafers into the process chamber or unloading wafers from the process chamber, said apparatus comprising:

a plurality of switches for detecting positions of the handler and for generating detection signals in accordance with said positions; and means for indicating whether the switches are operating normally.

2. The semiconductor fabrication apparatus of claim 1, said indicating means comprising a plurality of relays operated in accordance with a voltage level of each of the detection signals.

3. The semiconductor fabrication apparatus of claim 2, said indicating means further comprising a respective plurality of LEDs (light emitting diodes) associated with each of the plurality of relays, for identifying a normal operation of the handler.

4. The semiconductor fabrication apparatus of claim 3, wherein said switches are micro limit switches for respectively detecting a down state of a load fork, an up state of the load fork, a down state of an aligning plate, and an up state of the aligning plate.

5. The semiconductor fabrication apparatus of claim 4, wherein each of said plurality of relays comprises first and second input terminals, a normal open terminal, a common terminal, and a normal closed terminal, whereby the common terminal and the first input terminal are connected to a power source, and the second input terminal is connected to respective of the micro limit switches.

6. The semiconductor fabrication apparatus of claim 5, wherein said normal open terminal of each of the plurality of relays is connected to respective of the plurality of LEDs through a resistor.

7. The semiconductor fabrication apparatus of claim 6, wherein in each of the plurality of relays, said normal open terminal is connected to said common terminal to thereby make the LED conductive when the voltage level is sensed at the second input terminal.

8. The semiconductor fabrication apparatus of claim 6, wherein in each of the plurality of relays, said normal close terminal stays connected to said common terminal to thereby make the LED nonconductive when the voltage level is not sensed at the second input terminal.

* * * * *